United States Patent [19]
Sano

[11] Patent Number: 5,553,213
[45] Date of Patent: Sep. 3, 1996

[54] METHOD AND APPARATUS FOR DISPLAYING A PLURALITY OF SIGNAL WAVEFORMS APPEARING AT DIFFERENT TIME INTERVALS

[75] Inventor: Kayoko Sano, Tokyo, Japan

[73] Assignee: NEC Corporation, Tokyo, Japan

[21] Appl. No.: 331,756

[22] Filed: Oct. 31, 1994

[30] Foreign Application Priority Data

Oct. 29, 1993 [JP] Japan ................................ 5-271105

[51] Int. Cl.[6] ............................................ G06T 3/00
[52] U.S. Cl. ........................ 395/140; 395/139; 395/161
[58] Field of Search .................................. 395/140, 128, 395/133, 134, 135, 138, 139, 145, 147, 155, 161; 371/22.1, 16.3, 16.5; 364/413.02–413.06, DIG. 2, 424.03, 424.04; 324/115, 130

[56] References Cited

U.S. PATENT DOCUMENTS 4,623,984  11/1986  Yokokawa et al. ................ 364/DIG. 2
5,282,213  1/1994  Leigh et al. ............................ 371/22.1

FOREIGN PATENT DOCUMENTS

60-6874  1/1985  Japan.

*Primary Examiner*—Almis R. Jankus
*Attorney, Agent, or Firm*—Foley & Lardner

[57] ABSTRACT

A method of displaying signals includes the steps of determining display cut-out time intervals from waveform changing times of each of signals based on a predetermined time interval, and displaying the signals based on the determined display cut-out time intervals such that portions of the signals corresponding to the determined display cut-out time intervals are excluded. The determined display cut-out time intervals may be displayed such that portions of the signals corresponding to the determined display cut-out time intervals can be informed. In this case, predetermined patterns may be displayed. The predetermined pattern may be a pattern representing the waveform at the time when each of the determined display cut-out time intervals starts and having a predetermined time length. Alternatively, the predetermined pattern may be a pattern representing the waveform at the time when the corresponding determined display cut-out time interval starts and having a time length corresponding to that of the corresponding determined display cut-out time interval. The color of the pattern may be different from that of the signal.

17 Claims, 5 Drawing Sheets

METHOD AND APPARATUS FOR DISPLAYING A PLURALITY OF SIGNAL WAVEFORMS APPEARING AT DIFFERENT TIME INTERVALS

BACKGROUND OF THE INVENTION

1. Field of the Invention

The present invention relates to a signal waveform displaying method and an apparatus for it, and more particularly, to a displaying method and an apparatus capable of editing waveform data.

2. Description of Related Art

In a conventional signal waveform display method, the waveform display operation for a signal, e.g., a digital signal is performed uniformly all over the time period while the signal extends. Therefore, in order to observe the portion of waveform outside of a display window, the scroll operation needs to be repeated or the whole of the signal waveform needs to be compressed at a constant ratio with respect to the time axis.

Figure 5:
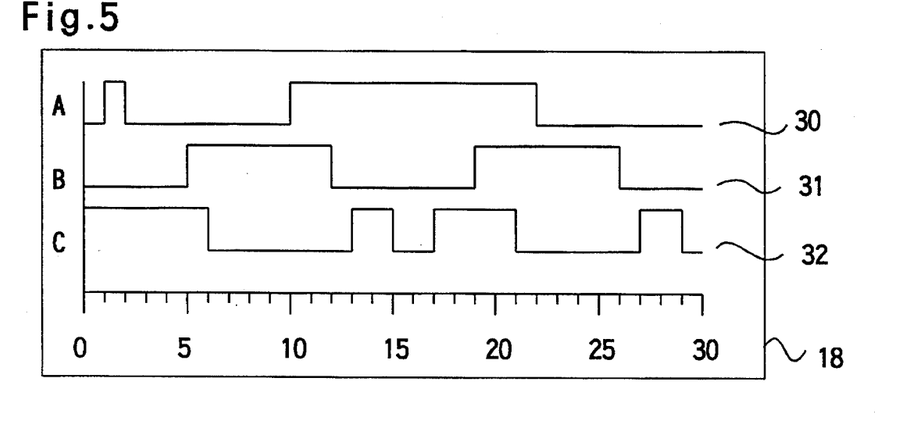
FIG. 5 is a view showing the waveforms of signals inputted to the waveform display apparatus of the present invention as they are.

In another conventional signal waveform display method, signals are inputted with a predetermined sample period of time and the waveforms at two adjacent sample periods are compared with each other so that the waveforms are displayed only when there are changes between the waveforms at the two adjacent sample periods. Such a method is disclosed in Japanese Patent Application Laid Open No. 60-6874, for instance. In the method, when signals shown in FIG. 5 are inputted, the signal waveforms are displayed as shown in FIG. 1.

However, in a case where the change of signal waveforms is to be observed, if the scroll operation of a display window is performed in order to compare a portion of the signal waveform with another portion thereof apart from the portion, there is a problem that the comparison is very difficult and the scroll operation requires a long time. Also, if the signal waveform is compressed with a constant ratio, there is another problem that the signal waveform is compressed below than the resolution of a display unit so that the signal waveform is deteriorated.

Figure 1:
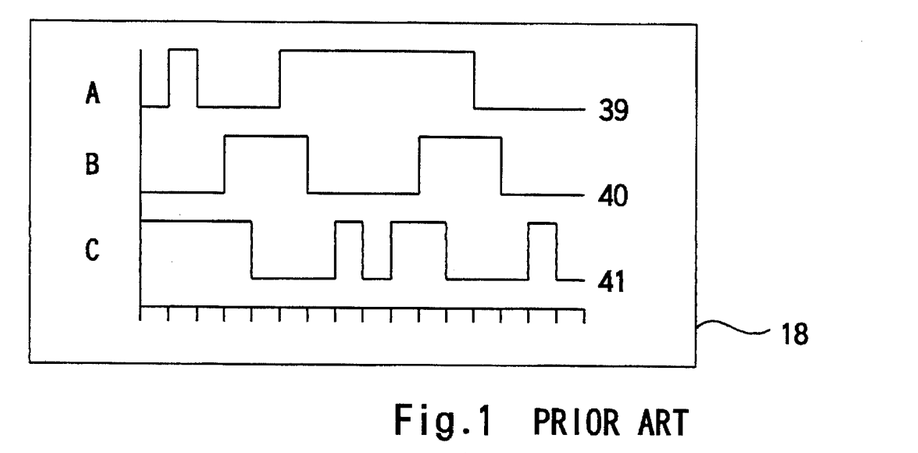
FIG. 1 is a view showing the waveforms of signals when the waveforms are compressed by a conventional waveform display apparatus.

As shown in FIG. 1, if only the changes of signal waveforms are displayed, there is caused still another problem that the time-varying characteristics of the signal waveform cannot be observed.

SUMMARY OF THE INVENTION

The first aspect of the present invention is to provide a method of displaying signals in which a portion where the signal waveform does not change can be excluded or cut out.

The second aspect of the present invention is to provide a method of displaying signals in which a pattern indicating that the portion is cut out is inserted or the portion is replaced by the pattern.

The third aspect of the present invention is to provide a method of displaying signals in which a user can be informed that the portion can be cut out.

The fourth aspect of the present invention is to provide an apparatus for displaying signals which can achieve the above one or more methods.

A method of displaying signals according to the present invention, includes the steps of:

determining display cut-out time intervals from waveform changing times of each of signals based on a predetermined time interval; and displaying the signals based on the determined display cut-out time intervals such that portions of the signals corresponding to the determined display cut-out time intervals are excluded.

In order to display the signals, the determined display cut-out time intervals may be displayed such that portions of the signals corresponding to the determined display cut-out time intervals can be informed.

In order to inform the determined cut-out time intervals, predetermined patterns may be displayed. The predetermined pattern may be a pattern representing the waveform at the time when each of the determined display cut-out time intervals starts and having a predetermined time length. Or the predetermined pattern may be a pattern representing the waveform at the time when the corresponding determined display cut-out time interval starts and has a time length corresponding to that of the corresponding determined display cut-out time interval. The color of the pattern may be different from that of the signal.

The display cut-out time intervals may be determined by (a) determining expected display cut-out time intervals for a first one of the signals, (b) determining display cut-out time intervals for a current one of the signals based on the determined expected display cut-out time intervals for a previous signal, the previous signal being the first signal when the current signal is a second signal, and (c) repeating said step (b) for all the signals other than the first signal to finally determine the display cut-out time intervals. Alternatively, the display cut-out time intervals may be determined by (a) determining a start time of one of the display cut-out time intervals for all the signals, (b) determining an end time of the one display cut-out time interval, and (c) repeating said steps (a) and (b) to finally determine the display cut-out time intervals.

DESCRIPTION OF THE PREFERRED EMBODIMENTS

The signal waveform display apparatus according to an embodiment of the present invention will be described below with reference to the accompanying drawings.

Figure 2:
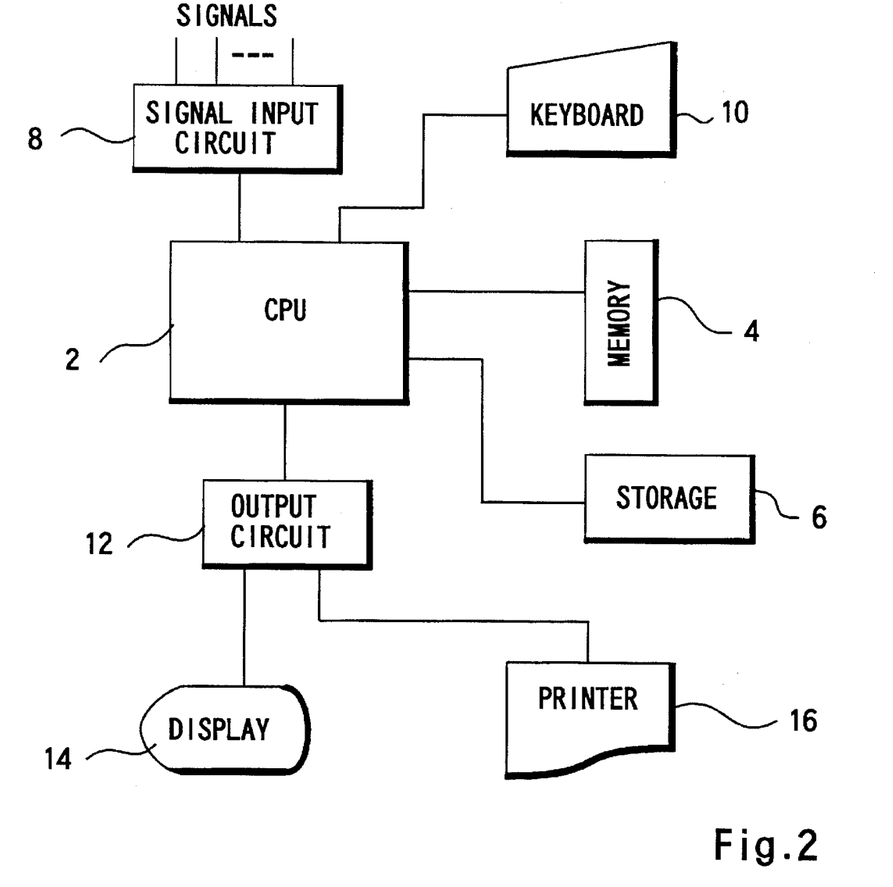
FIG. 2 is a diagram showing a waveform display apparatus according to an embodiment of the present invention.

First, the signal waveform display method and apparatus of the embodiment will be described with reference to FIG. 2. The signal waveform display apparatus includes a central processing unit (CPU) 2, a memory 4, a storage unit 6, a signal input circuit 8, a keyboard 10 with a mouse, an output circuit 12, a display unit 14, a printer 16.

The signal input circuit 8 receives signals. The CPU 2 receives the signals from the signal input circuit 8 to store them in the memory 4 or the storage unit 6 in response to an instruction from a user via the keyboard 10. The memory 4 mainly provides a temporary memory area to be used by the CPU 2 for a current operation such as data processing or executing commands. The storage unit 6 mainly stores data files or program files for a comparatively long time. When the signals are stored in the storage unit 6, the CPU reads out the signals to store in the memory 4 in response to an instruction from the user. The CPU 2 edits a copy of the signals stored in the memory 4. More particularly, signal waveform changing times are detected from the copy and display cut-out time intervals are determined based on the detected signal waveform changing times and a predetermined time interval during which data is stored in the storage unit 6. That is, if the display cut-out time interval is longer than the predetermined time interval, the portion of a signal corresponding to the display cut-out time interval is cut out, otherwise the portion is not cut out. In the above operation of detecting the waveform changing times, the start time and end time are determined based on the display window of the display unit 14. In response to an instruction from the user, the CPU 2 supplies the data of the edited signals to the display unit 14 or the printer 16 via the output circuit 12. In the above description, because the copy of signals is edited by the CPU 2, the original signals are remained and can be used for another type of processing.

Figure 3A:
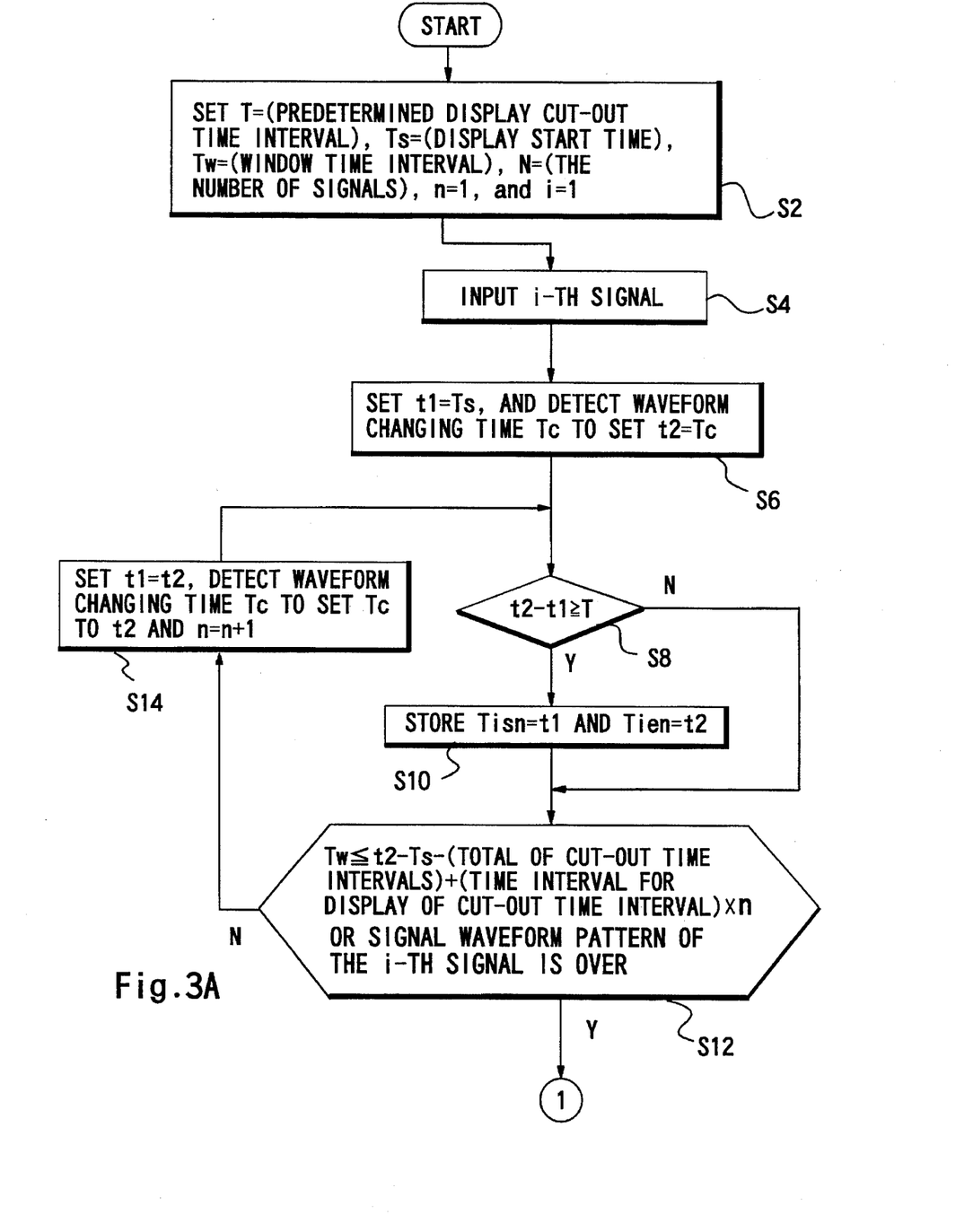
FIGS. 3A and 3B are flow charts showing the edit processing of the signal waveform display apparatus according to the first embodiment.

Next, an operation of the waveform display apparatus will be described below with reference to FIGS. 3A and 3B. Assume that the data representing signals A 30, B 31 and C 32 shown in FIG. 5 is stored in the memory 4 to have the data format shown in FIG. 4, in which each data is connected in series. At this time, the following edit processing for a copy of the signal data is performed. The signal data may be inputted from the signal input circuit 8 or read out from the storage unit 6.

Figure 4:
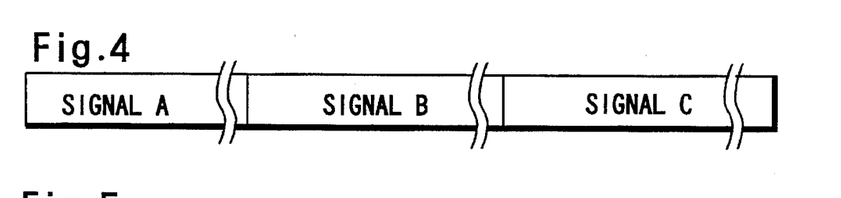
FIG. 4 is a format of data representing the signals A, B and C.

First, in a step S2 an initialization is performed. A display start time Ts of the signals within a display window 18, a time width Tw of the display window 18, the number of signals N, and a predetermined cut-out time interval T for which the waveform display is to be omitted or cut out are inputted via the keyboard 10 by the user. In this embodiment the time interval T is "3", the start time Ts is "0" the time width Tw is "25" and the number of signals N is "3". Also, variables n and i are set to 1. In a step S4 the estimation of the i-th signal, i.e., the signal A for compression display is started. In a step S6, the display start time Ts is first set to a variable t1 and then a waveform changing time is searched or detected after the time t1. In this case the first waveform changing time is the time "1". The detected waveform changing time is set to t2. In a step S8 whether or not the difference between t2 and t1 is greater than or equal to the cut-out time interval T is checked. The step S10 is executed when the answer is affirmative and a step S12 is executed when the answer is negative. In this case, since (1−0)<3, the step S12 is executed. If the detected waveform changing time is the time "10", the affirmative answer can be obtained in the step S8 and a step S10 is executed. In the step S10 the variables t1 and t2 are set to the start time Tisn and end time Tien of the cut-out time interval Tcut and stored in the storage unit 6. In this manner, the time Tisn indicates the n-th start time of the display cut-out time interval Tcut for the i-th signal. The time Tien indicates the n-th end time of the display cut-out time interval Tcut for the i-th signal. Subsequently, the step S12 is executed to judge whether at least one of the two conditions explained below is achieved and, if achieved, return an affirmative answer. In this case the operation progresses to the next step "1" shown in FIG. 3A. The first condition is to estimate the remained time width within the display window 18. That is, whether or not the time width of the i-th signal to be displayed exceeds the display window time width Tw is checked. More particularly, the calculation of $\{(t2-Ts)-(a\ sum\ of\ display\ cut-out\ time\ intervals\ Tcut)+\{(a\ time\ width\ necessary\ for\ display\ of\ the\ cut-out\ time\ interval\ Tcut)\times n\}$ is performed and whether or not the calculation result is greater than or equal to the display window time width Tw is checked. The second condition is to judge whether the signal data is over. That is, if the signal waveform editing operation is performed over whole data of the i-th signal stored in the memory as shown in FIG. 4, the answer becomes affirmative. When both of the answers returned from the two conditions are negative, a step S14 is executed to detect the next waveform changing time after t1 is set to t2. When the next waveform changing time Tc is detected, the detected waveform changing time is set as t2 and n is incremented by "1". Subsequently the step S8 is executed again. In this manner, the i-th signal waveform is modified or edited such that a portion of the i-th signal waveform corresponding to the cut-out time intervals can be omitted. In this operation, in the step 6, when the signal waveform data of the i-th signal is over, that is, when the whole data in the memory 4 shown in FIG. 4 is checked, the end time of the i-th signal waveform is returned as the waveform changing time Tc.

When the above operation is performed for the signal A 30, the following start times and end times of the display cut-out time intervals can be obtained.

| | |
|---|---|
| T1s1 = 2 | T1e1 = 10 |
| T1s2 = 10 | T1e2 = 22 |
| T1s3 = 22 | T1e3 = 30 |

Figure 3B:
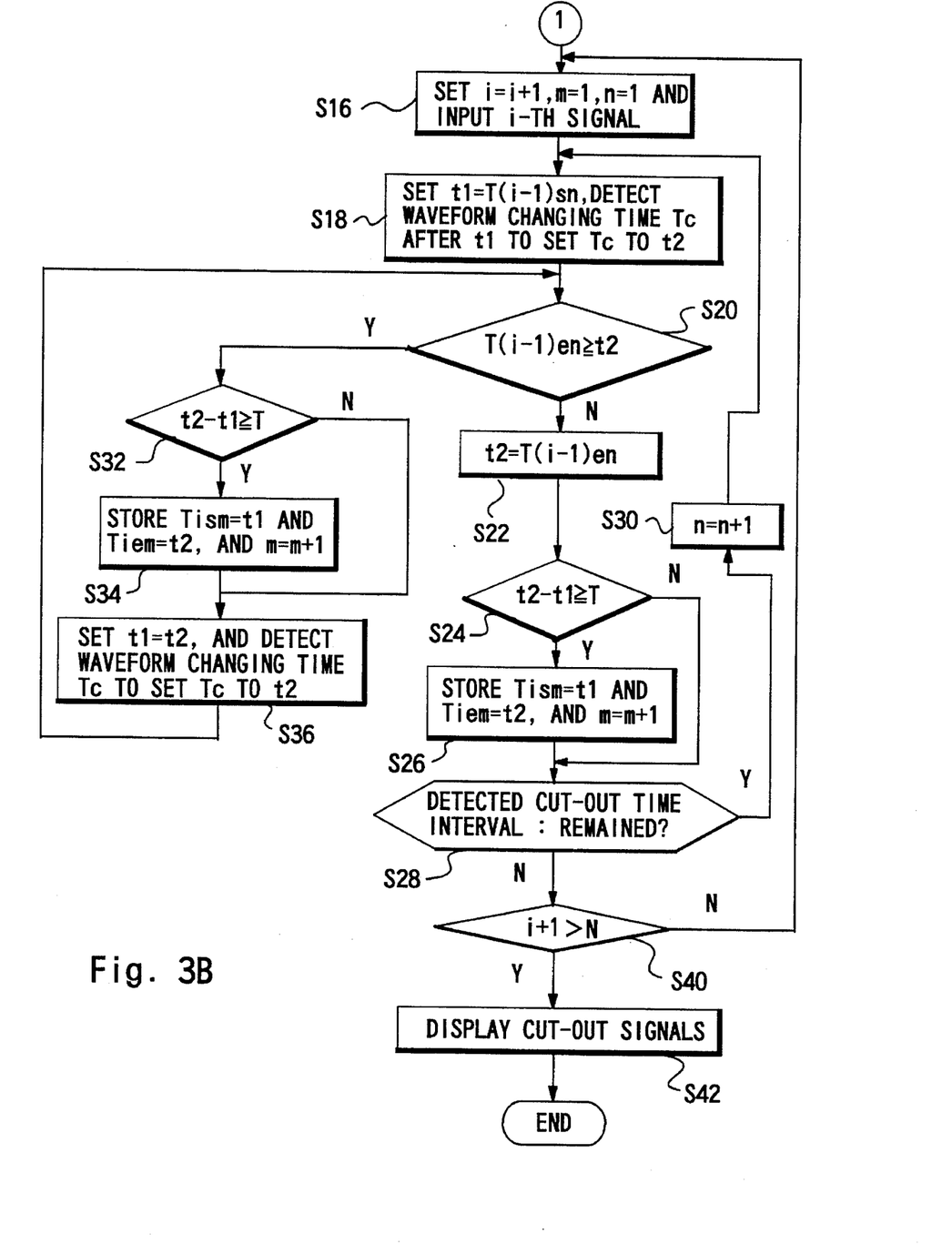

Next, when the answer of the step S12 is affirmative, a step S16 of FIG. 3B is executed. The variable i is incremented by "1" to indicate a next signal, the variable n is reset to "1", and a new variable m is introduced and set to "1". Then, the i-th signal, i.e., the signal B 31 is estimated. In a step S18 the start time T(i−1)sn of the n-th display cut-out time interval of the (i−1)-th signal, i.e., the start time T1s1 (=2) in this case, is first set to the variable t1. Then the first waveform changing time Tc of the i-th signal (the second signal B 31 in this case) after the start time T1s1 (=2) is detected as the time "5" to be set to the variable t2. In a step S20 the end time T(i−1)en of the n-th display cut-out time interval for the start time T(i−1)sn of the (i−1)-th signal is read out and whether or not the T(i−1)en is equal to or greater than the variable t2 is checked. If the answer is affirmative in the step S20, the flow goes to a step S32 and if the answer is negative the flow goes to a step S22. In this case, because T1e1 is "10" and the detected waveform changing time is "5", the answer is affirmative and the step S32 is executed. In the step S32 it is determined whether or not the difference (t2−t1) is greater than the predetermined cut-out time interval T. When the answer is affirmative a step S34 is executed and when the answer is negative a step S36 is executed. In this case, because t2=5, t1=2, and T=3, the answer is affirmative and the step S34 is executed. In the step S34 the times t1 and t2 are stored in the memory as the start time Tism and the end time Tiem of the detected display cut-out time interval Tcut, respectively. Then the variable m is incremented by "1". Next, in the step S36, the variable t2 is set to t1 and the next waveform changing time Tc is searched. When the next waveform changing time is detected as the time "12", the changing time is set to the variable t2 and thereafter the step S20 is executed again.

In this case, the answer of the step S20 is negative because the time T1en is "10" and the variable t2 is "12" and therefore the step S22 is executed. In the step S22 the display cut-out time interval end time T(i−1)en of the (i−1)th signal is set to the variable t2. In a step S24, whether or not the difference (t2−t1) is equal to or greater than the predetermined cut-out time interval T. When the answer is affirmative a step S28 is executed through a step S26 and when the answer is negative a step S28 is executed directly. In this case the answer is affirmative because t1=5, t 2=10 and T=3. In the step S26 the times t1 and t2 are stored in the memory 4 as the start time Tism and the end time Tiem of the detected display cut-out time interval Tc, i.e., T2s 2=5 and T2e2=10 are stored. Then the variable m is incremented by "1". In the step S28 whether or not there is still remained any display cut-out interval time for the (i−1)-th signal, i.e., the signal A 31 which is to be checked. When the answer is affirmative, the step S18 is executed again after the variable n is incremented by "1" in a step S30. When the answer is negative a step S40 is executed. In this manner, the following start times and end times of the display cut-out time intervals can be obtained, considering the signals A 30 and B 31.

| T2s1 = 2 | T2e1 = 5 |
| T2s2 = 5 | T2e2 = 10 |
| T2s3 = 12 | T2e3 = 19 |
| T2s4 = 19 | T2e4 = 22 |
| T2s5 = 22 | T2e5 = 26 |
| T2s6 = 26 | T2e6 = 30 |

Next, when the answer of the step S28 is negative, the step S40 is executed to determine whether or not (i+1) is greater than N, i.e., whether or not there is already not remained any signal to be evaluated. If the answer is negative the flow returns to the step S16 to evaluate the waveform of the i-th signal, i.e., the signal C 32. In this case, the display cut-out time intervals end times T2em are used as the end time of the cut-out time interval of the (i−1)-th signal in the steps S20 and S22. In this manner, the following the start times and end times of the display cut-out time intervals can be obtained.

| T3s1 = 2 | T3e1 = 5 |
| T3s2 = 6 | T3e2 = 10 |
| T3s3 = 22 | T3e3 = 26 |

Figure 6:
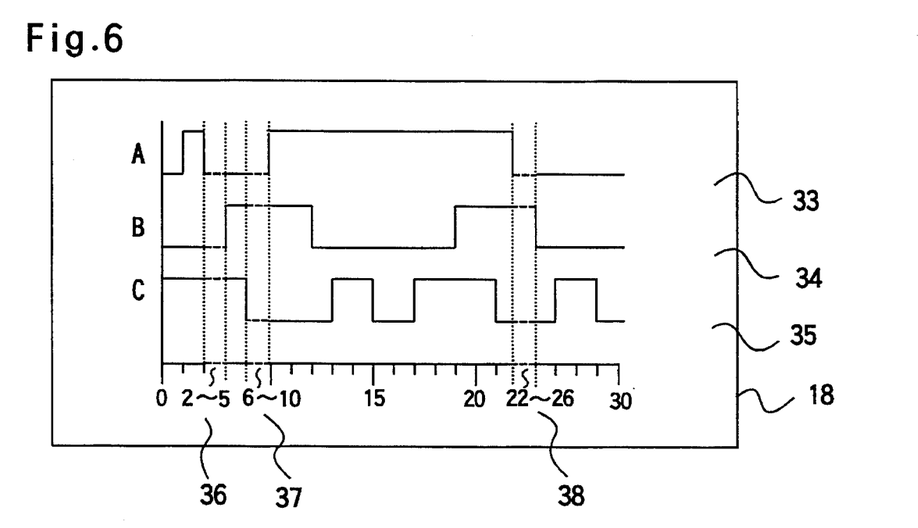
FIG. 6 is a view showing the waveforms of signals when the waveforms are edited by the waveform display apparatus of the present invention.

Next, when the answer of the step S40 is affirmative, a step S42 is executed and the signals A, B and C having the cut-out portions 36, 37 and 38 is displayed in the display window 18 of the display unit 14 based on the above start times T3s[m] and end times T3e[m], as shown in FIG. 6.

In this example, the display time intervals of the cut-out portions 36, 37 and 38 are equal to each other. That is, as shown in the step S12, the display time interval for display of each cut-out time interval is constant for each of the intervals 36, 37, 38 such as, for example, 1.5 as shown in FIG. 6. However, the display time interval may be proportional to the corresponding cut-out time interval linearly or in a step manner. For instance, in a linear proportional case if the cut-out time interval is "3", "6" and "9" the display time interval may be "1", "2" and "3". Alternatively, in the step case, if the cut-out time interval is "3", "6" and "9", the display time interval may be "1", "1" and "2" when "1" for the cut-out time interval in a range of "2" to "7" and "2" for the cut-out time interval in a range of "8" or above are set. Even in either case, the signal waveform can be observed in consideration of the duration time period of the waveform. Also, since the start time and end time of each display cut-out time interval are displayed it is convenient to the user.

In the embodiment, the pattern indicating the cut-out time interval is shown by a dashed line in FIG. 6. However, another pattern may be employed. The color of the pattern may be different from that of the signal. In addition, the pattern may be omitted. That is, the display cut-out time interval may not be displayed in accordance with an instruction from the user and only a colored dot may be shown at the point where the cut-out time interval is omitted. In this case, the term (time interval for display of cut-out time interval) * n of the step S12 in FIG. 3A is unnecessary.

Figure 7:
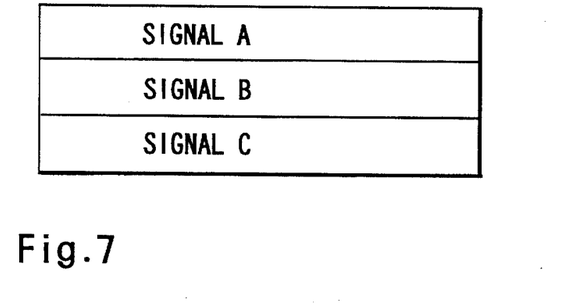
FIG. 7 is a format of data representing the signals A, B and C.

Next, the signal waveform displaying method and an apparatus for it according to another embodiment of the present invention will be described with reference to FIGS. 7 and 8. The configuration of the signal waveform display apparatus is the same as in the first embodiment. In the embodiment, the data of the signals A 30, B 31 and C 32 has the format shown in FIG. 7 and all the signals are processed in parallel in the edit processing as shown in FIG. 8.

Figure 8:
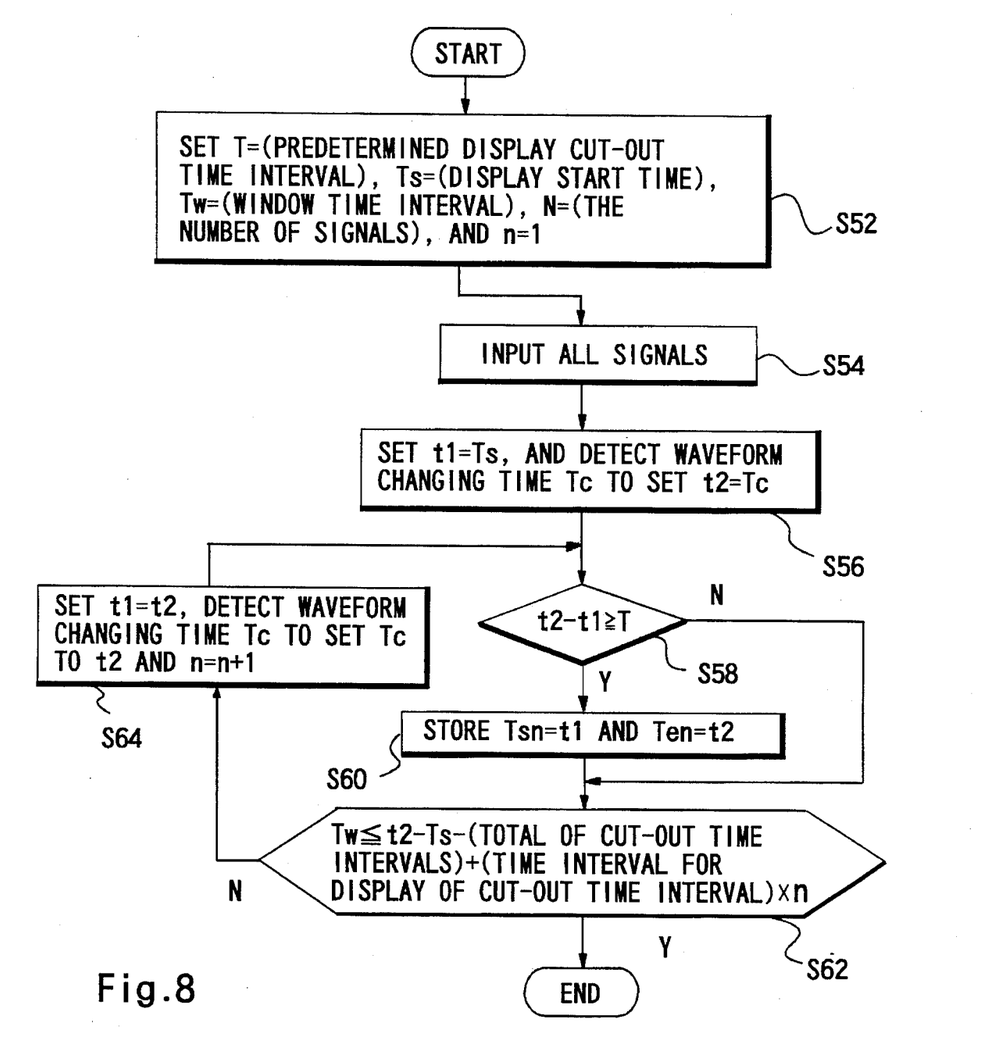
FIG. 8 is a flow chart showing the edit processing of the signal waveform display apparatus according to the second embodiment.

In the flow chart shown in FIG. 8, in a step S52 an initialization is first performed. The initialization is the same as in the step S2 of FIG. 3A. However, since all the signals A, B and C are processed the variable i is unnecessary. In a step S54 the estimation of all the signals are started in parallel. In a step S56, the display start time Ts equal to the display window start time is first set to a variable t1 and then a waveform changing time is searched or detected after the time t1 among all the signals. In this case the first waveform changing time is the time "1". The detected waveform changing time is set to t2. In a step S58 whether or not the difference between t2 and t1 is greater than or equal to the cut-out time interval T is checked. The step S60 is executed when the answer is affirmative and a step S62 is executed when the answer is negative. In this case, since (1−0)<3, the step S62 is executed. If the detected waveform changing time is the time "5", the affirmative answer can be obtained in the step S58 because the variable t1 is "2" at that time and a step S60 is executed. In the step S60 the variables t1 and t2 are set to the start time Tsn and end time Ten of the cut-out time interval Tcut and stored in the storage unit 6. In this manner, the time Tsn indicates the n-th start time of the display cut-out time interval Tcut among all the signals. Subsequently, the step S62 is executed to estimate the remained time width within the display window 18. That is, whether or not the estimated time width exceeds the display window time width Tw is checked. More particularly, the calculation of {(t2−Ts)−(a sum of display cut-out time intervals Tcut)+(a time width necessary for display of the cut-out time interval Tcut)×n} is performed and whether or not the calculation result is greater than or equal to the display window time width Tw is checked. When the answer is negative, a step S64 is executed so that the value of the variable t2 is set to the variable t1 and the next waveform changing time Tc is searched and detected. In this case, if the signal waveform data of all the signals A, B, C stored in the memory 4 as shown in FIG. 7 are over, the step S62 returns an affirmative answer regardless of the judging according to the calculation. When the next waveform changing time Tc is detected, the detected waveform changing time is set as t2 and n is incremented by "1". Subsequently the step S58 is executed again. In this manner, all the signal waveforms are modified or edited such that the portions of the signal waveforms corresponding to the cut-out time intervals can be omitted.

When the above operation is performed for all the signals, the following start times and end times of the display cut-out time intervals can be obtained, as in the first embodiment.

| Ts1 = 2  | Te1 = 5  |
|----------|----------|
| Ts2 = 6  | Te2 = 10 |
| Ts3 = 22 | Te3 = 26 |

In the second embodiment, all the waveform changing times needs to be estimated and therefore the long edit processing time is required. However, the flow is simple.

What is claimed is:

1. A method of displaying signals, comprising the steps of:

determining cut-out time intervals from waveform changing times of each of the signals, each of said cut-out time intervals being longer than a predetermined time interval;

determining display cut-out time intervals from said cut-out time intervals for said signals, each of the display cut-out time intervals being a time interval which is common between ones for said respective signals of said cut-out time intervals of said signals and longer than the predetermined time interval; and displaying the signals based on the determined display cut-out time intervals such that portions of the signals corresponding to the determined display cut-out time intervals are informed, wherein said displaying step includes displaying the signals based on the determined display cut-out time intervals such that the signal portions corresponding to each of the determined display cut-out time intervals has predetermined patterns, and wherein each of said predetermined pattern is a pattern representing the waveform at the time when each of the determined display cut-out time intervals starts and having a predetermined time length.

2. A method of displaying signals, comprising the steps of:

determining cut-out time intervals from waveform changing times of each of the signals, each of said cut-out time intervals being longer than a predetermined time interval;

determining display cut-out time intervals from said cut-out time intervals for said signals, each of the display cut-out time intervals being a time interval which is common between ones for said respective signals of said cut-out time intervals of said signals and longer than the predetermined time interval; and displaying the signals based on the determined display cut-out time intervals such that portions of the signals corresponding to the determined display cut-out time intervals are informed, wherein said displaying step includes displaying the signals based on the determined display cut-out time intervals such that the signal portions corresponding to each of the determined display cut-out time intervals has predetermined patterns, and wherein each of said predetermined patterns is a pattern representing the waveform at the time when the corresponding determined display cut-out time interval starts and having a time length corresponding to that of the corresponding determined display cut-out time interval.

3. A method of displaying signals, comprising the steps of:

determining cut-out time intervals from waveform changing times of each of the signals, each of said cut-out time intervals being longer than a predetermined time interval;

determining display cut-out time intervals from said cut-out time intervals for said signals, each of the display cut-out time intervals being a time interval which is common between ones for said respective signals of said cut-out time intervals of said signals and longer than the predetermined time interval; and displaying the signals based on the determined display cut-out time intervals such that portions of the signals corresponding to the determined display cut-out time intervals are informed, wherein said displaying step includes displaying the signals based on the determined display cut-out time intervals such that the signal portions corresponding to each of the determined display cut-out time intervals has predetermined patterns, and wherein said displaying step includes displaying the signals based on the determined display cut-out time intervals such that the signal portions corresponding to each of the determined display cut-out time intervals are displayed as the patterns having a color different from that of the signals.

4. A method of displaying signals, comprising the steps of:

determining cut-out time intervals from waveform changing times of each of the signals, each of said cut-out time intervals being longer than a predetermined time interval;

determining display cut-out time intervals from said cut-out time intervals for said signals, each of the display cut-out time intervals being a time interval which is common between ones for said respective signals of said cut-out time intervals of said signals and longer than the predetermined time interval; and displaying the signals based on the determined display cut-out time intervals such that portions of the signals corresponding to the determined display cut-out time intervals are informed, wherein said displaying step further includes the steps of:
   determining data of the signal portions corresponding to the determined display cut-out time intervals from data representing the signals; and
   displaying the signals based on the signal data from which the signal portion data is determined.

5. A method of displaying signals, comprising the steps of:

determining cut-out time intervals from waveform changing times of each of the signals, each of said cut-out time intervals being longer than a predetermined time interval;

determining display cut-out time intervals from said cut-out time intervals for said signals, each of the display cut-out time intervals being a time interval which is common between ones for said respective signals of said cut-out time intervals of said signals and longer than the predetermined time interval; and displaying the signals based on the determined display cut-out time intervals such that portions of the signals corresponding to the determined display cut-out time intervals are informed, wherein said step of determining display cut-out time intervals further comprises the steps of:
  (a) determining expected display cut-out time intervals for a first one of the signals;
  (b) determining display cut-out time intervals for a current one of the signals based on the determined expected display cut-out time intervals for a previous signal, the previous signal being the first signal when the current signal is a second signal; and
  (c) repeating said step (b) for all the signals other than the first signal to finally determine the display cut-out time intervals.

6. A method of displaying signals, comprising the steps of:

determining cut-out time intervals from waveform changing times of each of the signals, each of said cut-out time intervals being longer than a predetermined time interval;

determining display cut-out time intervals from said cut-out time intervals for said signals, each of the display cut-out time intervals being a time interval which is common between ones for said respective signals of said cut-out time intervals of said signals and longer than the predetermined time interval; and displaying the signals based on the determined display cut-out time intervals such that portions of the signals corresponding to the determined display cut-out time intervals are informed, wherein said step of determining display cut-out time intervals further comprises the steps of:
  (a) determining a start time of one of the display cut-out time intervals for all the signals;
  (b) determining an end time of the one display cut-out time interval; and
  (c) repeating said steps (a) and (b) to finally determine the display cut-out time intervals.

7. An apparatus for displaying signals, comprising:

determining means for determining data representing display cut-out time intervals from data representing waveform changing times of data representing signals based on a predetermined time interval data, each of the display cut-out time intervals being a waveform unchanging time interval which is longer than the predetermined time interval and common between said signals;

editing means for editing the signal data to remove the display cut-out time interval data from the signal data and to add a pattern data in place of the display cut-out time interval data; and display means for displaying the signal data based on the edited signal data such that portions of the signals corresponding to the determined display cut-out time intervals are cut out and patterns for the pattern data are informed, wherein each of said patterns is a pattern representing the waveform at the time when a corresponding one of the determined display cut-out time intervals starts and having a predetermined time length.

8. An apparatus for displaying signals, comprising:

determining means for determining data representing display cut-out time intervals from data representing waveform changing times of data representing signals based on a predetermined time interval data, each of the display cut-out time intervals being a waveform unchanging time interval which is longer than the predetermined time interval and common between said signals;

editing means for editing the signal data to remove the display cut-out time interval data from the signal data and to add a pattern data in place of the display cut-out time interval data; and display means for displaying the signal data based on the edited signal data such that portions of the signals corresponding to the determined display cut-out time intervals are cut out and patterns for the pattern data are informed, wherein each of said patterns is a pattern representing the waveform at the time when a corresponding one of the determined display cut-out time intervals starts and having a time length corresponding to that of the corresponding determined display cut-out time interval.

9. An apparatus for displaying signals, comprising:

determining means for determining data representing display cut-out time intervals from data representing waveform changing times of data representing signals based on a predetermined time interval data, each of the display cut-out time intervals being a waveform unchanging time interval which is longer than the predetermined time interval and common between said signals;

editing means for editing the signal data to remove the display cut-out time interval data from the signal data and to add a pattern data in place of the display cut-out time interval data; and display means for displaying the signal data based on the edited signal data such that portions of the signals corresponding to the determined display cut-out time intervals are cut out and patterns for the pattern data are informed, wherein said display means includes means for displaying the edited signal data based on the determined display cut-out time intervals such that patterns for the pattern data corresponding to each of the determined display cut-out time intervals are displayed with a color different from that of the signals.

10. An apparatus for displaying signals, comprising:

determining means for determining data representing display cut-out time intervals from data representing waveform changing times of data representing signals based on a predetermined time interval data, each of the display cut-out time intervals being a waveform unchanging time interval which is longer than the predetermined time interval and common between said signals;

editing means for editing the signal data to remove the display cut-out time interval data from the signal data and to add a pattern data in place of the display cut-out time interval data; and display means for displaying the signal data based on the edited signal data such that portions of the signals corresponding to the determined display cut-out time intervals are cut out and patterns for the pattern data are informed, wherein said determining means includes means for determining expected display cut-out time interval data for the signal data sequentially from a first one of the signals to finally determine the display cut-out time interval data.

11. An apparatus for displaying signals, comprising:

determining means for determining data representing display cut-out time intervals from data representing waveform changing times of data representing signals based on a predetermined time interval data, each of the display cut-out time intervals being a waveform unchanging time interval which is longer than the predetermined time interval and common between said signals;

editing means for editing the signal data to remove the display cut-out time interval data from the signal data and to add a pattern data in place of the display cut-out time interval data; and display means for displaying the signal data based on the edited signal data such that portions of the signals corresponding to the determined display cut-out time intervals are cut out and patterns for the pattern data are informed, wherein said determining means includes means for determining the display cut-out time interval data for the signal data in parallel for the signals to finally determine the display cut-out time intervals.

12. A method for displaying signal waveforms comprising the steps of:

detecting a fist time interval, when a first signal remains a constant level for an period longer than a predetermined constant time;

storing a first start time and a first end time each representing start and end points of said first time interval, said first end time indicating a time point when said first signal changes;

detecting a second time interval, when a second signal remains a constant level after said first start time;

setting a second start time to be equal to said first start time and setting a second end time to be equal to an end point of said second time interval of said second signal;

storing a first ending point being equal to one of said first end time and said second end time which precedes the other; and displaying waveforms of said first and second signals each having a portion corresponding to an interval which starts at said first start time and ends at said first ending point, the portion being replaced by a predetermined displaying pattern, said predetermined displaying pattern having a width corresponding to a time shorter than said time interval which is replaced, and said predetermined displaying pattern being labeled with figures representing time values of said first start time and said first ending point.

13. A method according to claim 12, wherein said displaying step includes displaying the waveforms of said first and second signals with a first color and the predetermined displaying pattern with a second color different from the first color.

14. A method according to claim 12, wherein said displaying step includes displaying a time axis in correspondence with the waveforms of said first and second signals and the predetermined displaying pattern.

15. A signal waveforms displaying apparatus comprising:

a memory storing signal waveform data of a first and a second signals and a predetermined constant time;

a processor for detecting a first time interval, when a first signal remains a constant level for an period longer than said predetermined constant time, storing a first start time and an first end time each representing a start and an end points of said first time interval in said memory, said first end time indicating a time point when said first signal changing, detecting a second time interval, when a second start time to be equal to said first start time and setting a second end time to be equal to an end point of said second time interval of said second signal, said processor thereafter storing a first ending point which is equal to one of said first end time and said second end time which precedes the other; and a displaying device for displaying waveforms of said first and second signals, replacing a portion of each of said signals corresponding to an interval starting at said first stat time and ending at said first ending point by a predetermined displaying pattern, said predetermined displaying pattern having a width corresponding to a time shorter than said time interval which is replaced, and labeling said predetermined displaying pattern with figures representing time values of said first start time and said first ending point.

16. A signal waveforms displaying apparatus according to claim 15, wherein said displaying device displays the waveforms of said first and second signals with a first color and the predetermined displaying pattern with a second color different from the first color.

17. A signal waveforms displaying apparatus according to claim 15, wherein said displaying device displays a time axis in correspondence with the waveforms of said first and second signals and the predetermined displaying pattern.

* * * * *